(12) United States Patent  
Miyakawa et al.

(10) Patent No.: US 12,072,313 B2  
(45) Date of Patent: Aug. 27, 2024

(54) GRAPHENE TRANSISTOR AND METHOD OF MANUFACTURING SAME

(71) Applicants: Murata Manufacturing Co., Ltd., Nagaokakyo (JP); OSAKA UNIVERSITY, Suita (JP)

(72) Inventors: Naruto Miyakawa, Nagaokakyo (JP); Ayumi Shinagawa, Nagaokakyo (JP); Shota Ushiba, Nagaokakyo (JP); Masahiko Kimura, Nagaokakyo (JP); Kazuhiko Matsumoto, Suita (JP); Takao Ono, Suita (JP)

(73) Assignees: MURATA MANUFACTURING CO., LTD., Kyoto (JP); OSAKA UNIVERSITY, Osaka (JP)

( * ) Notice: Subject to any disclaimer, the term of this patent is extended or adjusted under 35 U.S.C. 154(b) by 441 days.

(21) Appl. No.: 17/403,915

(22) Filed: Aug. 17, 2021

(65) Prior Publication Data

US 2021/0372966 A1 Dec. 2, 2021

Related U.S. Application Data

(63) Continuation of application No. PCT/JP2020/004066, filed on Feb. 4, 2020.

(30) Foreign Application Priority Data

Feb. 21, 2019 (JP) ................. 2019-029080

(51) Int. Cl.
*H01L 23/00* (2006.01)
*G01N 27/414* (2006.01)
*H01L 29/16* (2006.01)

(52) U.S. Cl.
CPC ..... *G01N 27/4145* (2013.01); *G01N 27/4146* (2013.01); *H01L 29/1606* (2013.01)

(58) Field of Classification Search
CPC ............ G01N 27/4145; G01N 27/4146; H01L 29/1606
See application file for complete search history.

(56) References Cited

U.S. PATENT DOCUMENTS

| 2009/0002541 A1 | 1/2009 | Niwamae |
| 2011/0095268 A1 | 4/2011 | Choi et al. |
| 2012/0298971 A1 | 11/2012 | Lee et al. |
| 2015/0270350 A1 | 9/2015 | Lagally et al. |

(Continued)

FOREIGN PATENT DOCUMENTS

| JP | 2012-247189 A | 12/2012 |
| JP | 2012-248842 A | 12/2012 |

(Continued)

OTHER PUBLICATIONS

Official Communication issued in International Patent Application No. PCT/JP2020/004066, mailed on Apr. 14, 2020.

(Continued)

*Primary Examiner* — Anthony Ho
(74) *Attorney, Agent, or Firm* — Keating & Bennett, LLP

(57) ABSTRACT

A graphene transistor includes a graphene layer including at least one sheet of graphene, a drain electrode and a source electrode each electrically connected to the graphene layer, a charge donor on at least one main surface of the graphene layer, the charge donor including an impurity charge, and a counter ion having a charge with a sign different from a sign of the impurity charge.

16 Claims, 8 Drawing Sheets

(56) References Cited

U.S. PATENT DOCUMENTS

| | | |
|---|---|---|
| 2016/0111180 A1 | 4/2016 | Joo et al. |
| 2017/0323945 A1 | 11/2017 | Haque et al. |
| 2018/0141521 A1 | 5/2018 | Irie et al. |
| 2018/0239218 A1 | 8/2018 | Ikeuchi et al. |
| 2018/0368743 A1 | 12/2018 | Lin et al. |
| 2020/0057301 A1 | 2/2020 | Kuratani et al. |
| 2020/0144939 A1 | 5/2020 | Fujimoto et al. |

FOREIGN PATENT DOCUMENTS

| | | |
|---|---|---|
| JP | 2018-163146 A | 10/2018 |
| KR | 10-2012-0034349 A | 4/2012 |
| WO | 2018198465 A1 | 11/2018 |
| WO | 2019030982 A1 | 2/2019 |

OTHER PUBLICATIONS

Extended European Search Report in EP20795214.4, mailed Oct. 7, 2022, 47 pages.

Extended European Search Report in EP 20758556.3, mailed Aug. 30, 2022, 6 pages.

GRAPHENE TRANSISTOR AND METHOD OF MANUFACTURING SAME

CROSS REFERENCE TO RELATED APPLICATIONS

This application claims the benefit of priority to Japanese Patent Application No. 2019-029080 filed on Feb. 21, 2019 and is a Continuation Application of PCT Application No. PCT/JP2020/004066 filed on Feb. 4, 2020. The entire contents of each application are hereby incorporated herein by reference.

BACKGROUND OF THE INVENTION

1. Field of the Invention

The present invention relates to a graphene transistor and a method of manufacturing a graphene transistor.

2. Description of the Related Art

For example, a graphene transistor (GFET) disclosed in Japanese Patent Laid-Open No. 2012-247189, Japanese Patent Laid-Open No. 2018-163146, or the like is used for biological sensing with a graphene layer of the graphene transistor (a surface of the graphene layer opposite to a surface of the graphene layer in contact with an insulative substrate) being in contact with a liquid including a specimen.

However, when the graphene layer of the graphene transistor is used with the graphene layer immersed in a liquid including ions, characteristics (response current, Dirac point voltage, and the like) of the graphene layer are disadvantageously changed over time. In this case, a result of sensing using the graphene transistor may be incorrectly recognized.

Figure 1:
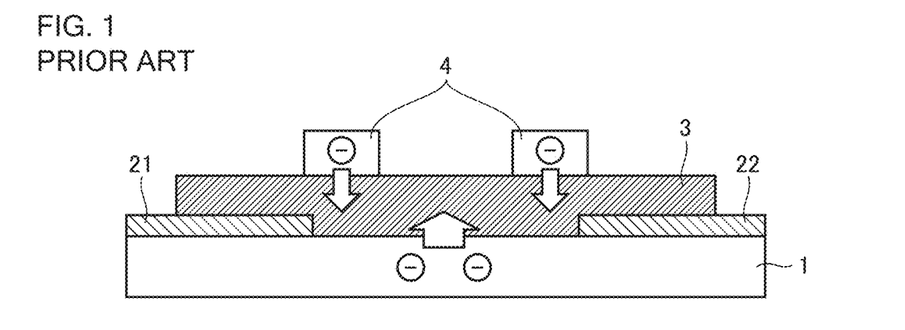
FIG. 1 is a schematic cross sectional view of a conventional graphene transistor.

This is presumably due to the following reason: in an initial (pre-use) state, a residue (insulative foreign matter 4) of an organic material (PMMA or the like), such as a resist, used for patterning of a graphene layer 3 and electrodes 21, 22, an insulative substrate 1, or the like defines and functions as a charge donor including impurity charges to become a doping source and a Coulomb scattering source for graphene layer 3 to cause a decreased mobility of graphene layer 3 (current is less likely to flow) (see FIG. 1). However, during use (during measurement), the ions in the liquid including the ions gradually permeate the charge donor to screen out (gradually cancel) an influence of the impurity charges, with the result that the mobility of graphene layer 3 is gradually changed (see FIGS. 2A and 2B).

SUMMARY OF THE INVENTION

Preferred embodiments of the present invention provide graphene transistors in each of which changes in characteristics of a graphene layer over time are reduce or prevented.

A graphene transistor according to a preferred embodiment of the present invention includes a graphene layer including at least one sheet of graphene; a drain electrode and a source electrode each electrically connected to the graphene layer; a charge donor located on at least one main surface of the graphene layer and including an impurity charge; and a counter ion having a charge with a sign different from a sign of the impurity charge.

In a graphene transistor according to a preferred embodiment of the present invention, the counter ion may be included in at least one of inside of the charge donor and an interface between the charge donor and the graphene layer.

In a graphene transistor according to a preferred embodiment of the present invention, the charge donor may be at least one of an insulative substrate that supports the graphene layer and an insulative foreign matter.

A graphene transistor according to a preferred embodiment of the present invention may include an insulative substrate that supports the graphene layer.

A graphene transistor according to a preferred embodiment of the present invention may further include a gate electrode capable of externally applying an electric field to the graphene layer.

In a method of manufacturing a graphene transistor according to a preferred embodiment of the present invention, the graphene transistor including a graphene layer including graphene, a drain electrode and a source electrode each electrically connected to the graphene layer, and a charge donor located on at least one main surface of the graphene layer and including an impurity charge, the method includes imparting a counter ion to the graphene transistor, the counter ion being an ion having a charge with a sign different from a sign of the impurity charge.

In a method of manufacturing a graphene transistor according to a preferred embodiment of the present invention, in the imparting of the counter ion, the graphene transistor may be immersed in an ionic solution including the counter ion.

According to preferred embodiments of the present invention, graphene transistors are provided in which each of changes in characteristics of a graphene layer over time are reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to drawings. It should be noted that in the drawings, the same reference characters represent the same or corresponding portions. Further, dimensional relationships such as length, width, thickness, and depth are changed appropriately for the sake of clarity and simplicity of the drawings, and do not represent actual dimensional relationships.

Graphene Transistor

Figure 2A:
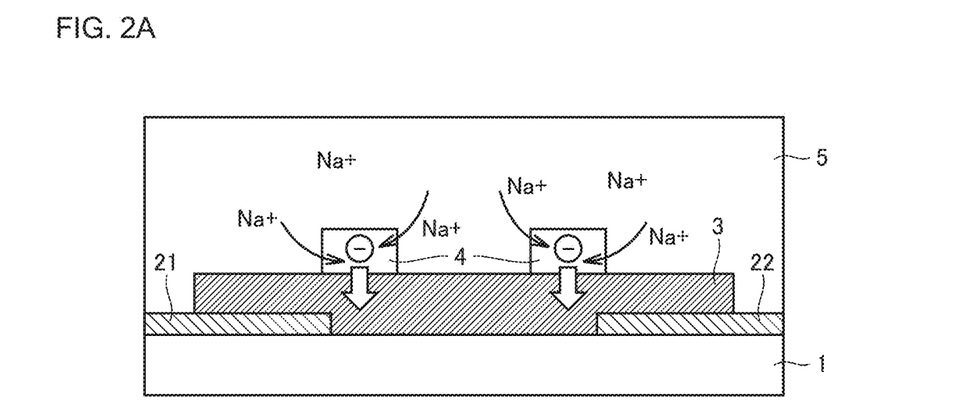
FIGS. 2A and 2B are schematic cross sectional views of a graphene transistor according to a preferred embodiment of the present invention.
Figure 2B:
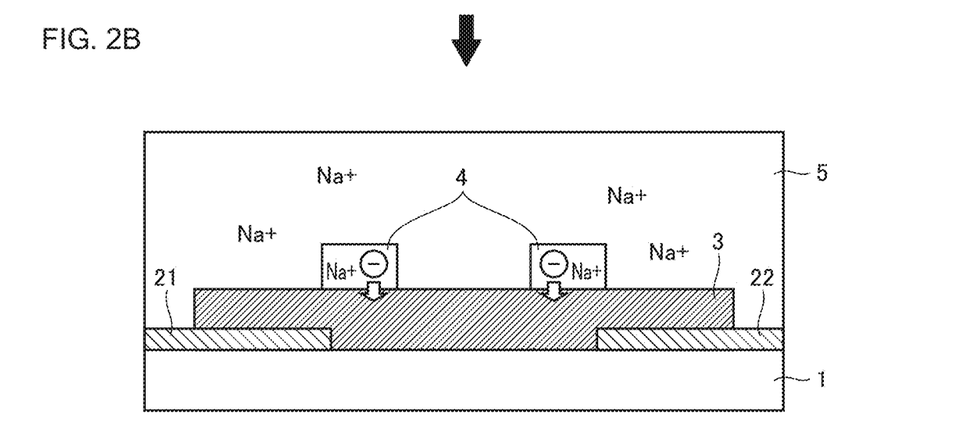

Referring to FIGS. 2A and 2B, a graphene transistor (graphene field effect transistor: GFET) of a preferred embodiment of the present invention includes a graphene layer 3 including at least one sheet of graphene, and a drain electrode 21 and a source electrode 22 each electrically connected to graphene layer 3.

The graphene transistor of the present preferred embodiment further includes a charge donor. The charge donor includes impurity charges and is on at least one main surface of graphene layer 3. The impurity charges are positive or negative charges. Examples of the impurity charges include a polar molecule ($H_2O$ or the like), an ionized functional group (an amino group, a carboxyl group, or the like), a radical, a dangling bond of a covalent material, and an element vacancy in a material (oxygen vacancy in an oxide or the like).

The charge donor is, for example, at least one of insulative substrate 1 that supports graphene layer 3 and an insulative foreign matter 4. Examples of the insulative foreign matter include a residue of an organic material (PMMA or the like), such as a resist, used for patterning of graphene layer 3 and electrodes 21, 22.

A feature of the graphene transistor of the present preferred embodiment is that the graphene transistor of the present preferred embodiment further includes counter ions. Each of the counter ions is an ion having a charge with a sign different from a sign of the impurity charge in the charge donor. With the counter ions, the impurity charges in the charge donor can be canceled to reduce the influence of the charge donor upon the graphene layer over time. Thus, changes in characteristics of the graphene layer over time can be reduced or prevented.

When the impurity charges are negative charges, examples of the counter ions include metal ions, hydrogen ions, or ions including positively chargeable functional groups. Examples of the metal ions include alkali metal ions (sodium ions ($Na^+$) or the like) and alkaline earth metal ions.

When the impurity charges are positive charges, examples of the counter ions include halogen ions, hydroxide ions, and ions including negatively chargeable functional groups.

The counter ions are preferably included inside the charge donor or in the vicinity of the charge donor to obtain the effect of canceling the influence of the impurity charges of the charge donor upon the graphene layer. Specifically, the counter ions are preferably included in at least one of inside of the charge donor and an interface between the charge donor and the graphene layer, for example. With the counter ions being provided at such a position, the influence of the charge donor upon the graphene layer over time can be reduced more reliably.

It should be noted that the graphene transistor shown in FIGS. 2A and 2B includes insulative substrate 1, and graphene layer 3, drain electrode 21, source electrode 22, and the like are provided on one main surface of insulative substrate 1. However, in the present preferred embodiment, the graphene transistor does not need to include insulative substrate 1.

The graphene transistor of the present preferred embodiment may further include a gate electrode (not shown) capable of externally applying an electric field to graphene layer 3.

It should be noted that, for example, the main surface of graphene layer 3 (main surface of graphene layer 3 opposite to the insulative substrate) may be modified with a functional group that can adsorb a detection target or that can bind to the detection target. Further, for example, a receptor (an antibody, an aptamer, or the like) that can bind to the detection target may be bound to the main surface of graphene layer 3. The receptor may be bound to the graphene layer via a linker, for example. Thus, the graphene transistor of the present preferred embodiment can be suitably used as a sensor (biosensor or the like) to specifically detect a detection target. A virus is included in the detection target.

The thickness of graphene layer 3 and the number of graphene layer(s) 3 are not particularly limited, but are, for example, about 0.3 nm to about 5 nm and 1 to 10 layers. The thickness of insulative substrate 1 is not particularly limited.

Method of Manufacturing Graphene Transistor

Hereinafter, a non-limiting example of a method of manufacturing the graphene transistor according to the present preferred embodiment will be described.

The manufacturing method of the present preferred embodiment is a method of manufacturing the graphene transistor, the graphene transistor including a graphene layer 3 including graphene, and a drain electrode 21 and a source electrode 22 each electrically connected to graphene layer 3, and a charge donor on at least one main surface of graphene layer 3, the charge donor including the impurity charges.

The manufacturing method of the present preferred embodiment includes a counter ion imparting step of imparting counter ions to the graphene transistor, each of the counter ions being an ion having a charge with a sign different from a sign of the impurity charge.

Examples of a method of imparting the counter ions to the graphene transistor in the counter ion imparting step include, but are not particularly limited to, a method of immersing the graphene transistor in an ionic solution including the counter ions. In this way, the counter ions can permeate at least one of the inside of the charge donor and the interface between the charge donor and graphene layer 3.

Examples of the ionic solution include, but are not particularly limited to, a phosphate-buffered saline (PBS), a sodium chloride solution, a potassium chloride solution, a magnesium chloride solution, a sodium hydroxide solution, and the like.

For example, referring to FIGS. 2A and 2B, by immersing the graphene transistor in ionic solution 5 including the counter ions ($Na^+$), the counter ions permeate insulative foreign matter 4 (charge donor) including the impurity charges (negative (−) charges) (see FIG. 2A). Thus, the influence (white arrows in the figure) of the impurity charges of insulative foreign matter 4 (charge donor) upon graphene layer 3 can be reduced (see FIG. 2B).

Figure 3:
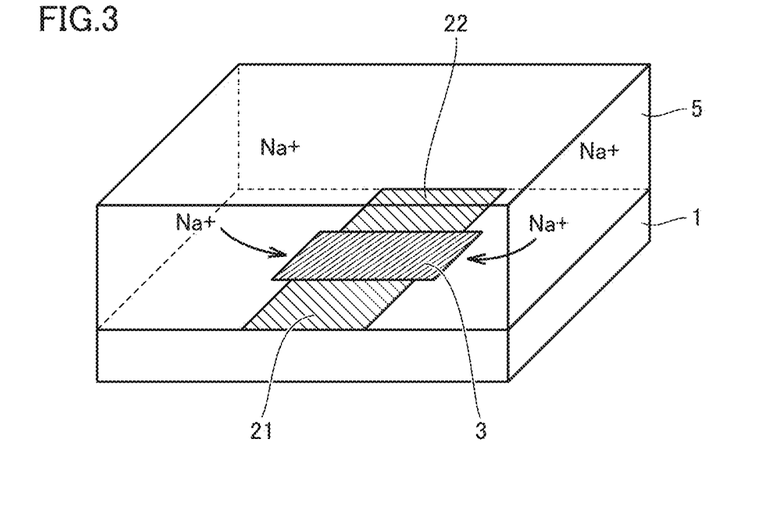
FIG. 3 is a schematic perspective view of a graphene transistor according to a preferred embodiment of the present invention.
Figure 4A:
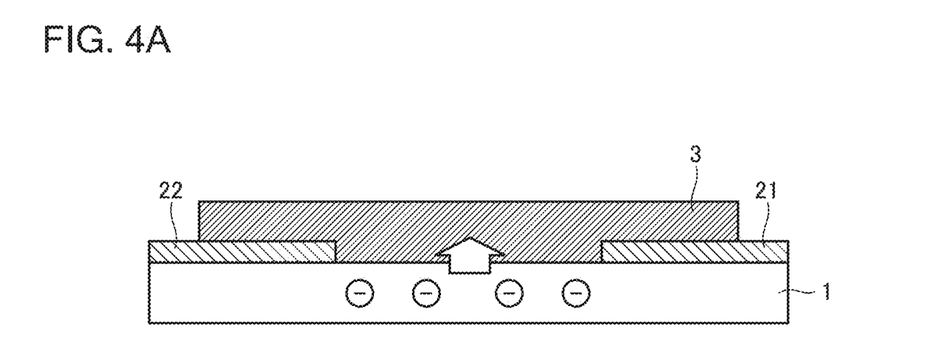
FIGS. 4A and 4B are schematic cross sectional views of a graphene transistor according to a preferred embodiment of the present invention.
Figure 4B:
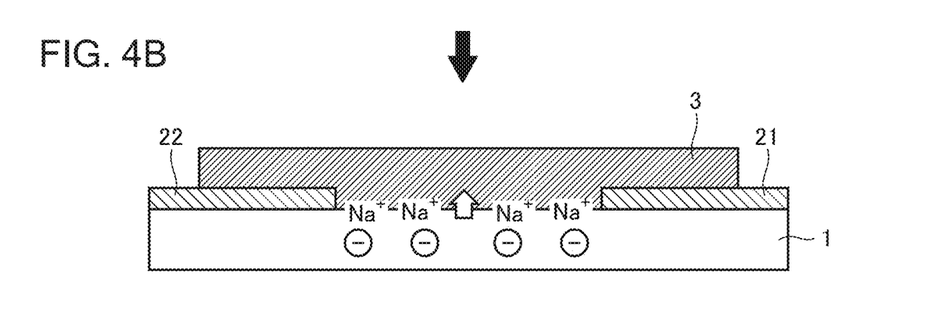

Further, for example, referring to FIG. 3, by immersing the graphene transistor in ionic solution 5 including the counter ions ($Na^+$), the counter ions permeate the interface between insulative substrate 1 (charge donor) including the impurity charges (negative (−) charges) and graphene layer 3 (see FIG. 3). Thus, referring to FIGS. 4A and 4B, the influence (white arrow in FIGS. 4A and 4B) of the impurity charges of insulative substrate (charge donor) upon graphene layer 3 can be reduced (see FIGS. 4A and 4B).

An immersion time into the ionic solution is not particularly limited, the immersion time may be any time with which the counter ions can permeate at least one of the inside of the charge donor and the interface between the charge donor and graphene layer 3 or may be a time longer than that, and the immersion time is preferably more than or equal to about 2 hours, and more preferably more than or equal to about 10 hours, for example.

In the step of imparting the counter ions, an electric field may be applied between the gate electrode and graphene layer 3 with the graphene transistor being immersed in the ionic solution. Further, the hydraulic pressure of ionic solution 5 may be increased with the graphene transistor being immersed in the ionic solution. With such an operation, the counter ions efficiently permeate the charge donor or the like.

Further, the step of imparting the counter ions may be performed by a method other than the method of immersing the graphene transistor in the ionic solution. For example, in the present preferred embodiment, the following step is also encompassed in the step of imparting the counter ions. The counter ions are previously included in a material (resist material (PMMA or the like) that can define and function as insulative foreign matter 4, or insulative substrate 1 that can define and function as the charge donor, and they are used to manufacture a graphene transistor.

The graphene transistor can be manufactured by various known methods. Examples of a method of forming graphene layer 3 include a method of forming a graphene layer on a copper foil by a chemical vapor deposition (CVD) method and transferring the graphene layer onto an insulative substrate. Further, the method of forming graphene layer 3 is not limited thereto, and, for example, the following methods may be used: a method of transferring, onto an insulative substrate, a graphene layer obtained from natural graphite or the like by mechanical removal or the like; a method of forming a graphene layer on an insulative substrate by performing heat treatment onto a SiC substrate (insulative substrate); a method of obtaining a graphene layer by reduction of graphene oxide; or the like.

EXAMPLES

Comparative Example 1

A graphene transistor (GFET) as shown in FIG. 1 was produced as Comparative Example 1 by forming a graphene layer on one main surface of a SiO substrate (insulative substrate) by the CVD method and performing patterning (lithography) using PMMA as a resist.

Comparative Example 2

A graphene transistor of Comparative Example 2 was obtained by immersing the same graphene transistor as that of Comparative Example 1 in deionized water for about 50 hours.

Example 1

A graphene transistor of Example 1 of a preferred embodiment of the present invention was obtained by immersing the same graphene transistor as that of Comparative Example 1 in about 15 mM phosphate-buffered saline (PBS) for about 50 hours.

Measurement of $I_{DS}$-$V_g$ Characteristic of Graphene

For each of the graphene transistors of Example 1, Comparative Example 1, and Comparative Example 2, the $I_{DS}$-$V_g$ characteristic of the graphene layer was measured.

Specifically, a gate voltage ($V_g$) [top gate voltage] was applied by the gate electrode with its tip immersed in the PBS with the PBS being present (for example, depth: about 5 mm) on the respective surfaces of the graphene layer, the drain electrode, and the source electrode opposite to the insulative substrate. The $I_{DS}$-$V_g$ characteristic of the graphene was measured by measuring the drain current ($I_{DS}$) when the gate voltage was changed between about −0.1 V and about 0.3 V. Measurement results are shown in FIG. 5.

Figure 5:
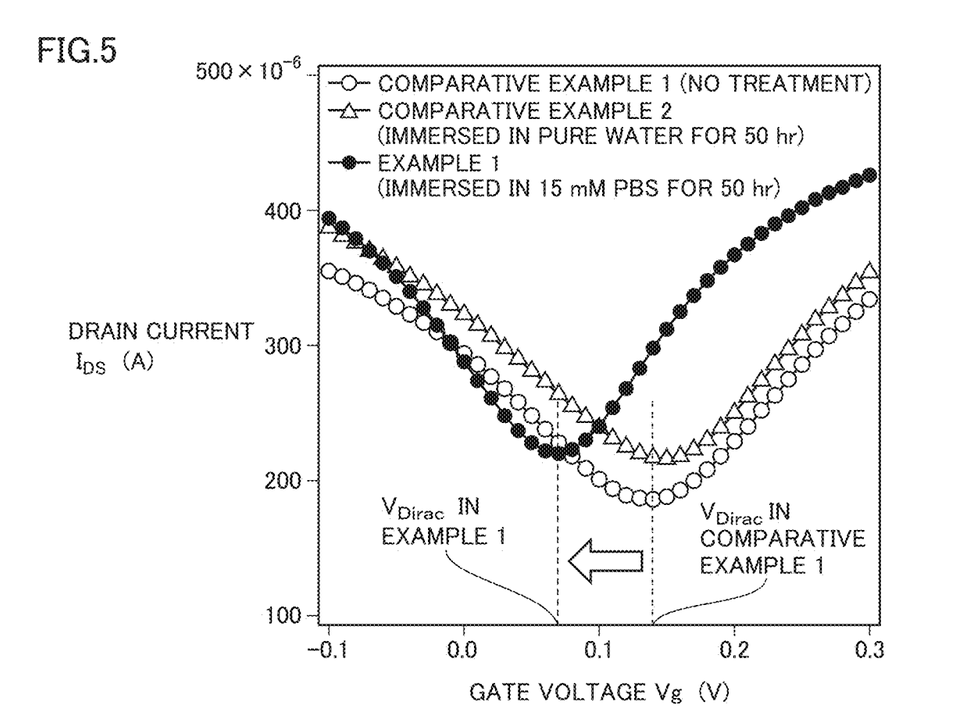
FIG. 5 is a graph showing an $I_{DS}$-$V_g$ characteristic (relation between a gate voltage and a drain current) of graphene in Examples of preferred embodiments of the present invention.

As shown in FIG. 5, in Example 1 involving the immersion in the PBS, it is understood that $V_{Dirac}$ is changed as compared with Comparative Example 1 (white arrow in the figure). It is considered that a component in the PBS affects the characteristic of the graphene layer in view of the fact that in Comparative Example 2 only involving the immersion in the water, $V_{Dirac}$ is hardly changed as compared with Comparative Example 1.

It should be noted that the Dirac point (DP) voltage ($V_{Dirac}$) is a value of $V_g$ at which the value of $I_{DS}$ becomes minimum in the drain current ($I_{DS}$)-gate voltage ($V_g$) characteristic as shown in FIG. 5.

In a sensor using the graphene transistor, for example, measurement of a detection target can be performed based on an amount of change in $V_g$ when the detection target is attached to the graphene layer, an amount of change in $I_{DS}$ at a specific $V_g$, or the like.

Figure 6:
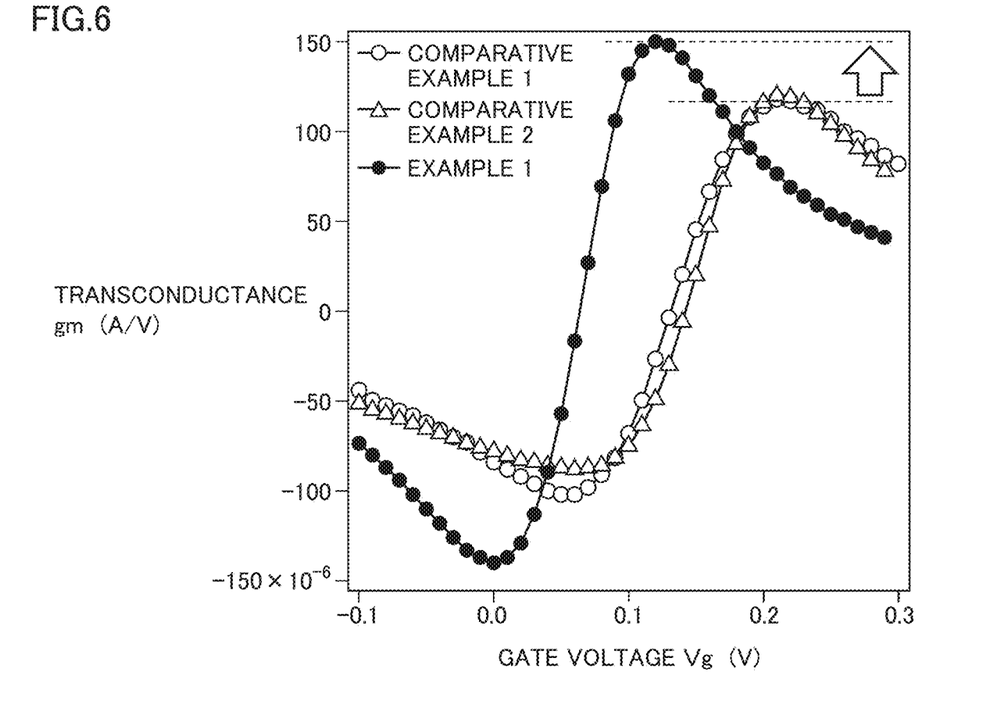
FIG. 6 is a graph showing a relationship between the gate voltage ($V_g$) and a transconductance (gm) in the Examples.

FIG. 6 shows a relationship between the gate voltage ($V_g$) and a transconductance (gm) in Example 1 and Comparative Examples 1 and 2. The transconductance (gm) is the slope ($dI_{DS}/dV_g$) in the $I_{DS}$-$V_g$ characteristic shown in FIG. 5. The transconductance (gm) is an index representing sensitivity of the drain current with respect to a change in bias voltage between the gate electrode and the source electrode.

As shown in FIG. 6, in Example 1, the maximum value of gm is larger than those in Comparative Examples 1 and 2 (white arrow in the figure), and the minimum value of gm is smaller than those in Comparative Examples 1 and 2. As the absolute value of gm is larger, the sensitivity of the measurement in sensing using the graphene transistor is higher, so that it is considered that the sensitivity of the measurement using the graphene transistor of Example 1 is improved as compared with those in Comparative Examples 1 and 2.

Figure 7:
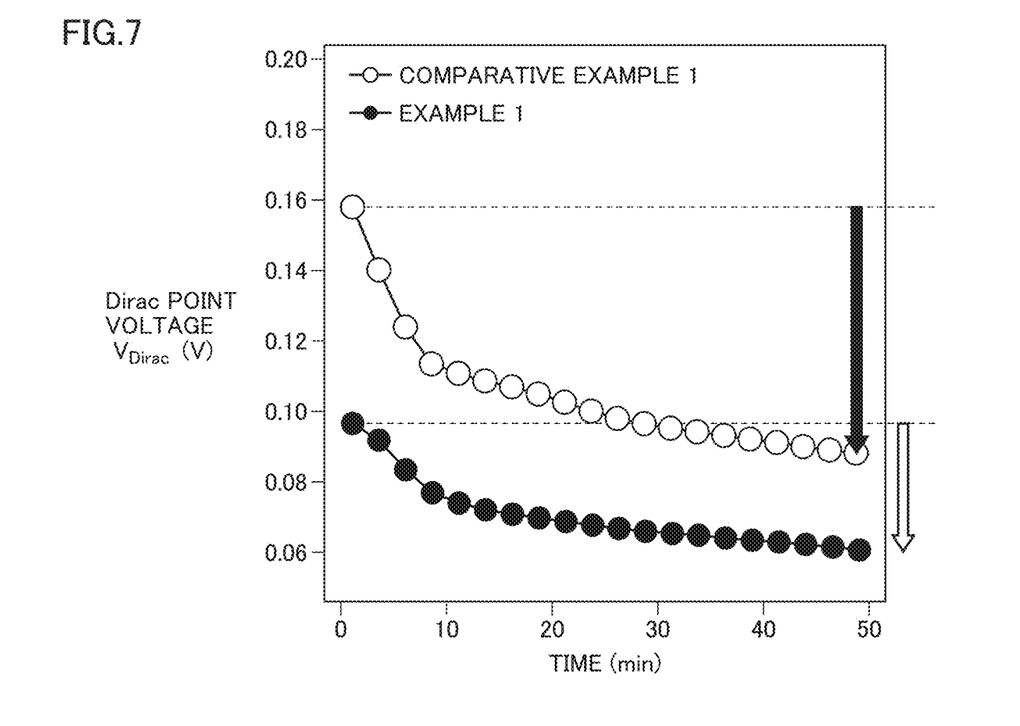
FIG. 7 is a graph showing a relationship between a time having passed from start of measurement and a Dirac point voltage ($V_{Dirac}$) in the Examples.
Figure 8:
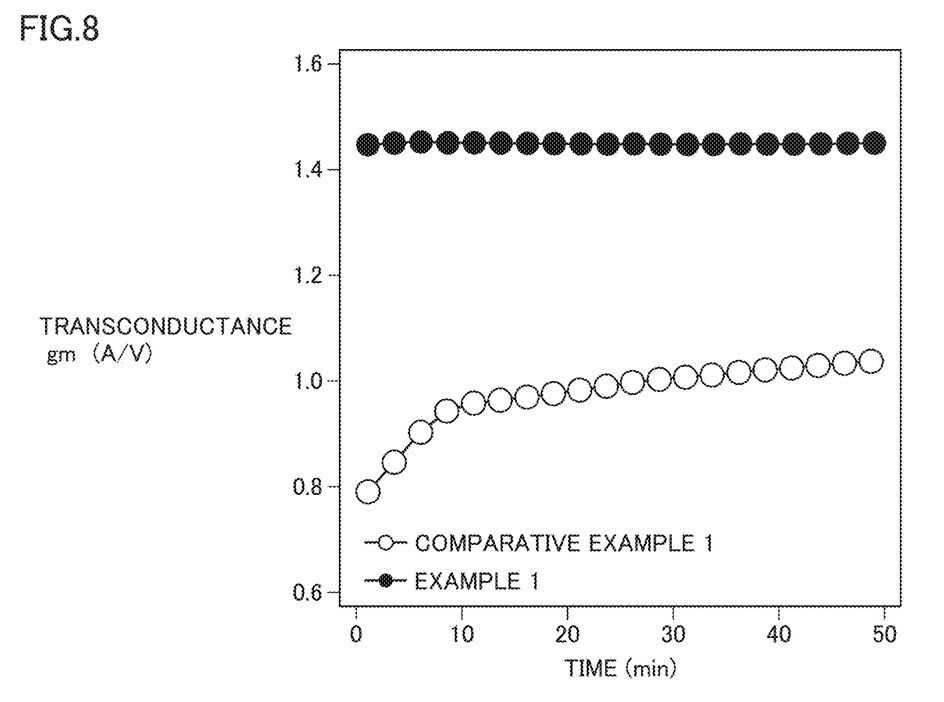
FIG. 8 is a graph showing a relationship between the time having passed from the start of measurement and the transconductance (gm) in the Examples.

FIG. 5 (and FIG. 6) show results immediately after starting the above-described measurement of the $I_{DS}$-$V_g$ characteristic, whereas FIG. 7 shows a change in $V_{Dirac}$ until about 50 minutes passed from the start of the measurement in each of Example 1 and Comparative Example 1, and FIG. 8 shows a change in gm until about 50 minutes passed from the start of the measurement in each of Example 1 and Comparative Example 1.

As shown in FIG. 7, in the graphene transistor of Example 1 having been immersed in the PBS, the change in $V_{Dirac}$ over time (white arrow in the figure) is smaller than the change in $V_{Dirac}$ over time (black arrow in the figure) in Comparative Example 1.

Further, as shown in FIG. 8, it is understood that in the graphene transistor of Example 1 having been immersed in the PBS, the change in gm over time is smaller than the change in gm over time in Comparative Example 1.

In view of the above-described results, it is understood that by immersing the graphene transistor in the PBS, the changes in characteristics of the graphene layer over time are reduced or prevented.

This is presumably due to the following reason. Since the counter ions (Na$^+$) in the ionic solution (PBS) had permeated at least one of the inside of the charge donor (at least one of the PMMA residue (insulative foreign matter) and the insulative substrate) and the interface between the charge donor and the graphene layer in the initial (pre-use) state, the influence of the impurity charges in the charge donor upon the graphene layer had already been reduced or prevented, so as to avoid such a phenomenon that the influence of the impurity charges in the charge donor upon the graphene layer is gradually reduced or prevented by the liquid (PBS) used for the measurement.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A graphene transistor comprising:
   a graphene layer including at least one sheet of graphene;
   a drain electrode and a source electrode each electrically connected to the graphene layer;
   a charge donor located on at least one main surface of the graphene layer and including an impurity charge; and
   a counter ion having a charge with a sign different from a sign of the impurity charge; wherein
   the charge donor is at least one of an insulative substrate that supports the graphene layer and an insulative foreign matter.

2. The graphene transistor according to claim 1, wherein the counter ion is included in at least one of inside of the charge donor and an interface between the charge donor and the graphene layer.

3. The graphene transistor according to claim 1, further comprising the insulative substrate that supports the graphene layer.

4. The graphene transistor according to claim 1, further comprising a gate electrode to externally apply an electric field to the graphene layer.

5. A sensor for detecting a virus comprising the graphene transistor according to claim 1.

6. The graphene transistor according to claim 1, wherein the impurity charge is at least one of a polar molecule, an ionized functional group, a radical, a dangling bond of a covalent material, and an element vacancy in a material.

7. The graphene transistor according to claim 1, wherein the counter ion includes at least one of a metal ion, a hydrogen ion, or an ion including a positively chargeable functional group.

8. The graphene transistor according to claim 1, wherein the counter ion includes at least one of a halogen ion, a hydroxide ion, and an ion including a negatively chargeable functional group.

9. The graphene transistor according to claim 1, wherein a thickness of the graphene layer is about 0.3 nm to about 5 nm.

10. The sensor according to claim 5, wherein the counter ion is included in at least one of inside of the charge donor and an interface between the charge donor and the graphene layer.

11. The sensor according to claim 5, further comprising the insulative substrate that supports the graphene layer.

12. The sensor according to claim 5, further comprising a gate electrode to externally apply an electric field to the graphene layer.

13. The sensor according to claim 5, wherein the impurity charge is at least one of a polar molecule, an ionized functional group, a radical, a dangling bond of a covalent material, and an element vacancy in a material.

14. The sensor according to claim 5, wherein the counter ion includes at least one of a metal ion, a hydrogen ion, or an ion including a positively chargeable functional group.

15. The sensor according to claim 5, wherein the counter ion includes at least one of a halogen ion, a hydroxide ion, and an ion including a negatively chargeable functional group.

16. The sensor according to claim 5, wherein a thickness of the graphene layer is about 0.3 nm to about 5 nm.

* * * * *